(12) United States Patent
Ko et al.

(10) Patent No.: US 9,059,424 B2
(45) Date of Patent: Jun. 16, 2015

(54) OLED DISPLAY APPARATUS AND METHOD OF MANUFACTURING THE SAME

(75) Inventors: Moo-Soon Ko, Yongin (KR); Jae-Ho Yoo, Yongin (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 8 days.

(21) Appl. No.: 12/907,211

(22) Filed: Oct. 19, 2010

(65) Prior Publication Data

US 2011/0127500 A1 Jun. 2, 2011

(30) Foreign Application Priority Data

Nov. 30, 2009 (KR) ........................ 10-2009-0117071

(51) Int. Cl.
*H01L 29/08* (2006.01)
*H01L 51/52* (2006.01)
*H01L 27/32* (2006.01)

(52) U.S. Cl.
CPC ......... *H01L 51/5206* (2013.01); *H01L 27/3211* (2013.01); *H01L 27/3246* (2013.01); *H01L 2251/308* (2013.01)

(58) Field of Classification Search
CPC ............................... H01L 51/52; H01L 51/56

USPC ............ 257/40, E51.022, 4, E51.018; 438/35
See application file for complete search history.

(56) References Cited

U.S. PATENT DOCUMENTS 7,129,637 B2   10/2006   Nakayama
2001/0001050 A1   5/2001   Miyashita et al.

(Continued)

FOREIGN PATENT DOCUMENTS

CN   101556991 A   10/2009
JP   2005038642 A   2/2005

(Continued)

OTHER PUBLICATIONS

Korean Office Action issued by Korean Industrial Property Office on May 11, 2011, corresponding to Korean Patent Application No. 10-2009-0117071 and Request for Entry of the Accompanying Office Action.

(Continued)

*Primary Examiner* — Caleb Henry
(74) *Attorney, Agent, or Firm* — Robert E. Bushnell, Esq.

(57) ABSTRACT

An organic light-emitting diode (OLED) display apparatus and a method of manufacturing the OLED display apparatus, the apparatus includes anode electrodes having different thicknesses for different types of sub-pixels.

17 Claims, 7 Drawing Sheets

(56) References Cited

U.S. PATENT DOCUMENTS

| | | | |
|---|---|---|---|
| 2005/0140288 A1 | 6/2005 | Suzuki | |
| 2005/0142976 A1* | 6/2005 | Suzuki | 445/24 |
| 2007/0102737 A1 | 5/2007 | Kashiwabara et al. | |
| 2007/0138478 A1* | 6/2007 | Son et al. | 257/72 |
| 2008/0218091 A1* | 9/2008 | Jo et al. | 315/169.3 |
| 2008/0284324 A1* | 11/2008 | Chun et al. | 313/504 |
| 2009/0194780 A1 | 8/2009 | Kwon | |

FOREIGN PATENT DOCUMENTS

| | | |
|---|---|---|
| JP | 2005197009 A | 7/2005 |
| JP | 2007123067 A | 5/2007 |
| JP | 2008218427 A | 9/2008 |
| KR | 20040096539 A | 11/2004 |
| KR | 2005-0051646 A | 6/2005 |
| KR | 20050067055 A | 6/2005 |
| KR | 100659766 B1 | 12/2006 |

OTHER PUBLICATIONS

Chinese Office Action issued by Chinese Patent Office on Jan. 27, 2014, in connection with Chinese Patent Application Serial No. 201010519011.2, which also claims Korean Patent Application Serial No. 10-2009-0117071 as its priority document and Request for Entry of the Accompanying Office Action.

Japanese Office Action issued by Japanese Patent Office on Jun. 3, 2014 in connection with JP 2010-236372 which also claims KP 10-2009-0117071 as its priority document and Request for Entry of the Accompanying Office Action.

* cited by examiner

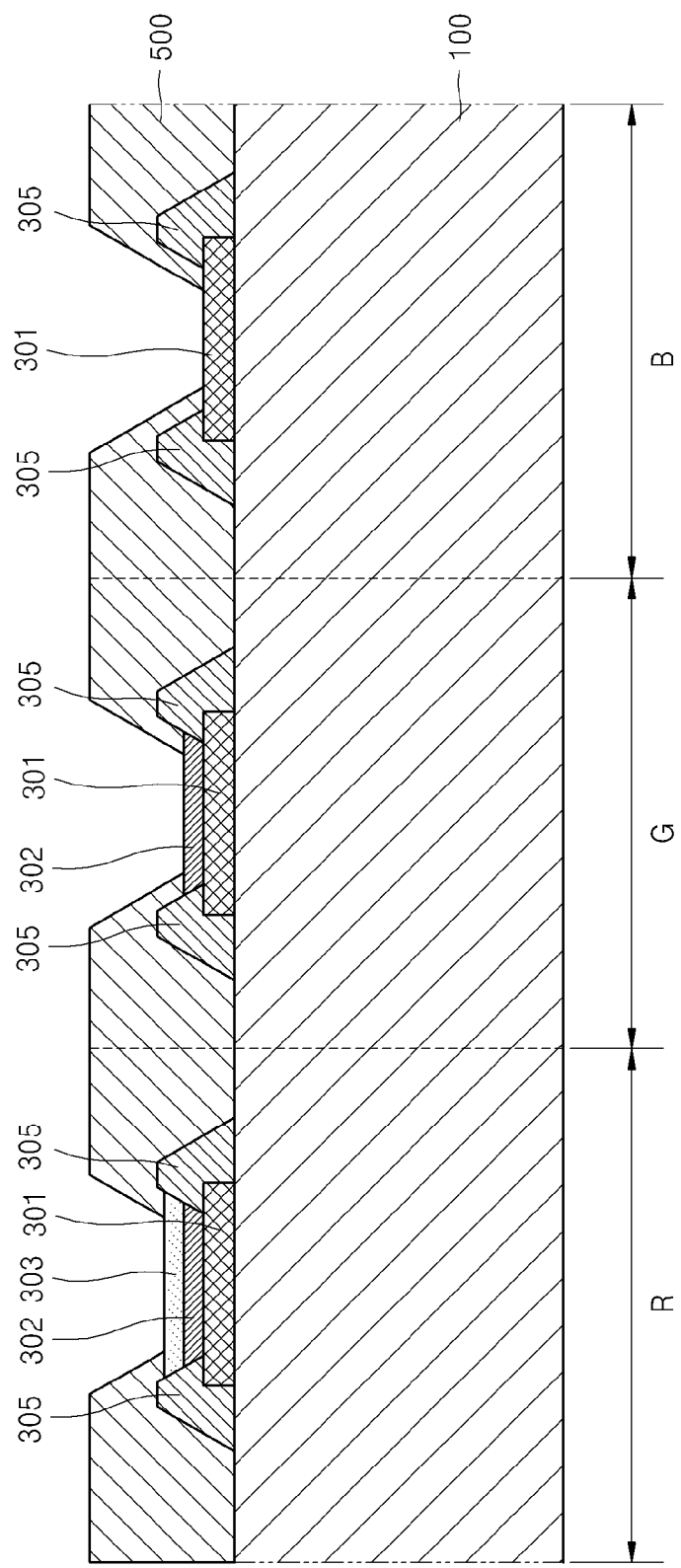

OLED DISPLAY APPARATUS AND METHOD OF MANUFACTURING THE SAME

CROSS-REFERENCE TO RELATED APPLICATION

This application claims the benefit of Korean Patent Application No. 10-2009-0117071, filed Nov. 30, 2009, in the Korean Intellectual Property Office, the disclosure of which is incorporated herein, by reference.

BACKGROUND

1. Field

The present disclosure relates to an organic light-emitting diode (OLED) display apparatus and a method of manufacturing the same.

2. Description of the Related Art

In general, an organic light-emitting diode (OLED) display is a self-emissive display device that electrically excites fluorescent organic compounds, to emit light. An OLED display can be driven at a low voltage, and can have a small thickness, a good viewing angle, and a fast response speed. Thus, OLED displays are considered to be the next-generation of display devices, which overcome the problems associated with liquid crystal devices.

In an OLED, an organic light-emitting layer, in the form of a functional thin film, is inserted between an anode electrode and a cathode electrode. Holes are injected from the cathode electrode, and electrons are injected from the anode electrode. As the electrons and holes are combined in the organic light-emitting layer, excitons are formed, and light is emitted as the excitons return to a ground state.

OLED display apparatuses are divided into a bottom emission-type, in which light is emitted toward a substrate, and a top emission-type, in which a light is emitted away from a substrate. If a thin-film transistor (TFT) is mounted in a bottom emission-type OLED display apparatus, a surface from which light is emitted, that is, an aperture rate, may be limited, due to a large surface area of the TFT on the substrate. On the other hand, a top emission-type OLED display apparatus has a large light emitting area regardless of a TFT surface area, and thus, has a large aperture rate.

When manufacturing the top emission-type OLED display apparatus, a reflection layer is formed under the anode electrode that is electrically connected to a source electrode or a drain electrode of a TFT, in order to increase light extraction. However, due to microcavity effects, between the reflection layer, the anode electrode, and the cathode electrode, color wavelengths may be split, and the luminance or the color coordinates of the colors may vary. Also, when etching the reflection layer using a wet etching solution, metals included in the reflection layer may be damaged, due to penetration of the etching solution.

In order to prevent the microcavity effects, buffer layers are formed on an organic layer, between the anode electrode and the cathode electrode, to adjust a distance between the anode electrode and the cathode electrode, so as to form an appropriate resonance structure. In order to form buffer layers having different thicknesses for R, G, and B colored sub-pixels, different deposition masks are used, and thus, an increased amount of organic materials are consumed.

SUMMARY

The present disclosure provides an organic light-emitting diode (OLED) display apparatus having sub-pixels of different thicknesses.

The present disclosure also provides an OLED display apparatus in which the quality thereof can be improved and the material costs thereof can be reduced by reducing a number of defects by preventing damage of lower reflection electrodes.

According to an aspect of the present disclosure, there is provided an organic light-emitting diode (OLED) display apparatus comprising: a first anode electrode formed in each of first through third sub-pixel regions, wherein the first anode electrodes are separated from each other; a cladding that is formed on the substrate, to cover edges of the first electrodes and to expose the substrate; second anode electrodes formed on the first anode electrodes, in the first sub-pixel region and the second sub-pixel region; and a third anode electrode formed on the second anode electrode of the first sub-pixel region.

According to another aspect of the present disclosure, there is provided a method of manufacturing an organic light-emitting diode (OLED) display apparatus, the method comprising: forming first anode electrodes in first through third sub-pixel regions of a substrate; forming a cladding that covers edges of the first anode electrodes and exposes a portion of the substrate; forming second anode electrodes on the first anode electrodes of the first sub-pixel region and the second sub-pixel region; and forming a third anode electrode on the second anode electrode of the first sub-pixel region.

According to various embodiments, the cladding may comprise at least one selected from the group consisting of an acrylic organic compound, polyamide, and polyimide.

According to various embodiments, the first anode electrode may comprise at least one structure selected from the group consisting of ITO/Ag/ITO, ITO/Ag/IZO, ITO/Ag alloy/ITO (ATD), and ITO/Ag—Pd—Cu (APC) alloy/ITO.

According to various embodiments, the second anode electrode may comprise at least one selected from the group consisting of ITO, IZO, ZnO, and $In_2O_3$.

According to various embodiments, the third anode electrode may comprise at least one selected from the group consisting of ITO, IZO, ZnO, and $In_2O_3$.

According to various embodiments, the first sub-pixel may be a red sub-pixel, and the second sub-pixel may be a green sub-pixel, and the third sub-pixel may be a blue sub-pixel.

Additional aspects and/or advantages of the disclosure will be set forth in part in the description which follows and, in part, will be obvious from the description, or may be learned by practice of the disclosure.

BRIEF DESCRIPTION OF THE DRAWINGS

These and/or other aspects and advantages of the present disclosure will become more apparent, by describing in detail exemplary embodiments thereof with reference to the attached drawings, of which:

FIGS. 3 through 7 are cross-sectional views illustrating a method of manufacturing a top emission-type OLED display apparatus, according to an exemplary embodiment of the present disclosure.

DETAILED DESCRIPTION DISCLOSURE

Figure 1:
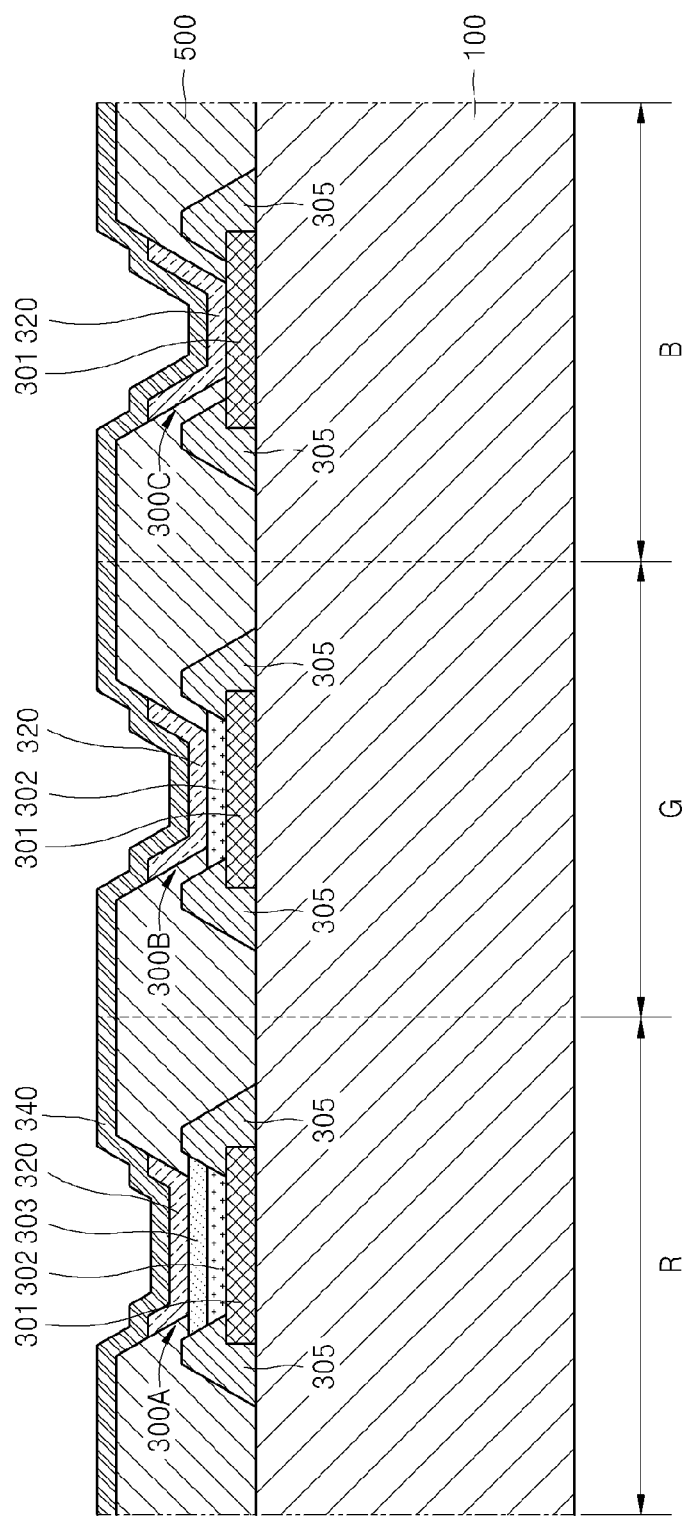
FIGS. 1 and 2 are cross-sectional views illustrating a top emission-type organic light-emitting diode (OLED) display apparatus, according to an exemplary embodiment of the present disclosure.

Reference will now be made in detail to the exemplary embodiments of the present disclosure, examples of which are illustrated in the accompanying drawings, wherein like reference numerals refer to the like elements throughout. The exemplary embodiments are described below, in order to explain the aspects of the present disclosure, by referring to the figures.

In the drawings, the thicknesses of layers and regions may be exaggerated for clarity. Herein, when a first element is referred to as being formed or disposed "on" a second element, the first element can be disposed directly on the second element, or one or more other elements may be disposed therebetween. When a first element is referred to as being formed or disposed "directly on" a second element, no other elements are disposed therebetween.

Figure 2:
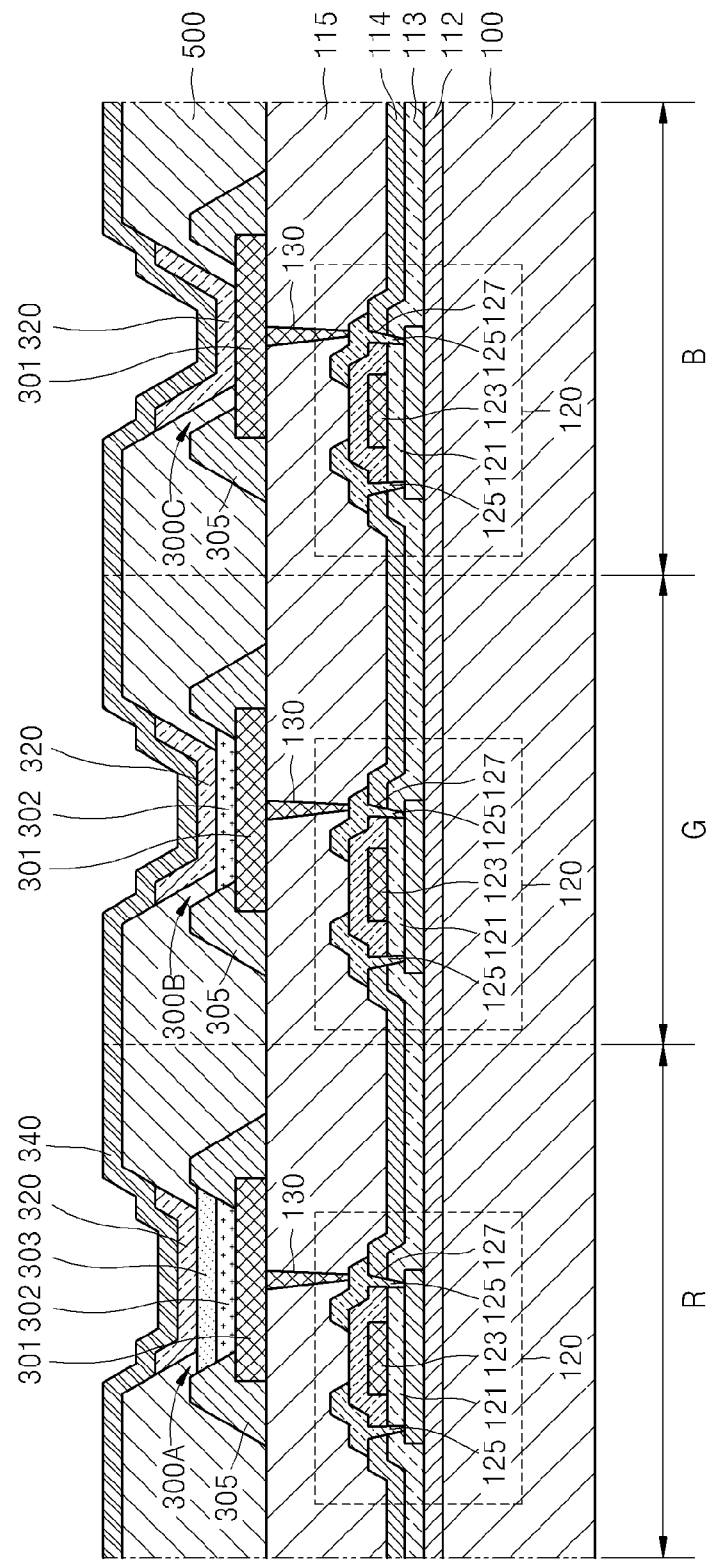

FIGS. 1 and 2 are cross-sectional views illustrating a top emission-type organic light-emitting diode (OLED) display apparatus, according to an exemplary embodiment of the present disclosure. Referring to FIG. 1, the top emission-type OLED display apparatus includes a substrate 100, upon which pixels are formed. Each pixel includes red (R), green (G), and blue (B) sub-pixel regions, in which red (R), green (G), and blue (B) light producing sub-pixels are formed.

The substrate 100 may be formed of a glass material; however the present disclosure is not limited thereto. For example, the substrate 100 may be formed of a plastic or a metal. Although not shown in FIG. 1, an insulating layer may be further disposed on the substrate 100. The insulating layer planarizes a surface of the substrate 100 and prevents the diffusion of impurities into the substrate 100. The substrate 100 may be transparent or opaque.

Anode electrode 300A-300C are respectively formed in each of the red (R), green (G), and blue (B) sub-pixel regions. The anode electrodes 300A-300C are separated from each other. The thicknesses of the anode electrodes 300 A-300C are different. The anode electrode 300A of the red (R) sub-pixel region includes a first anode electrode 301, a second anode electrode 302, and a third anode electrode 303. The anode electrode 300B of the green (G) sub-pixel region includes the first anode electrode 301 and the second anode electrode 302. The anode electrode 300C of the blue (B) sub-pixel region includes the first anode electrode 301. A cladding 305 is formed on opposing edges of the first anode electrodes 301 of each of the red (R), green (G), and blue (B) sub-pixel regions.

A pixel defining layer 500 is formed on the substrate 100 and includes openings that expose the anode electrodes 300A-300C. In other words, the pixel defining layer 500 extends between, and onto, the anode electrodes 300A-300C.

An organic layer 320, which may be referred to as a light emitting layer, is formed on the exposed portions of each of the anode electrodes 300A-300C. A cathode electrode 340 is formed on the organic layer 320 and the pixel defining layer 500.

A driving circuit 120, which may be a thin film transistor (TFT), is electrically connected to each of the anode electrodes 300A-300C. The driving circuits 120 may be formed on the substrate 100, as illustrated in FIG. 2.

Referring to FIG. 2, an insulating layer 112 may be formed on the substrate 100. The insulating layer 112 prevents the diffusion of impurities, such as ions, into the substrate 100, and prevents the penetration of water and/or air. The insulating layer 112 may also planarize the surface of the substrate 100. The insulating layer 112 may include a barrier layer and/or a buffer layer.

The TFT includes an active layer 121, which is formed of a semiconductor material, disposed on the insulating layer 112, and a gate insulating layer 113 that is formed to cover the active layer 121. The active layer 121 may be formed of an inorganic material such as amorphous silicon, polysilicon, or an organic semiconductor. The active layer 121 includes a source region, a drain region, and a channel region between the source and drain regions.

When the active layer 121 is formed of polysilicon, a predetermined area of the active layer 121 may be doped with impurities. Obviously, the active layer 121 may be formed of amorphous silicon instead of polysilicon, or of organic semiconductor materials such as pentacene. When the active layer 121 is formed of polysilicon, amorphous silicon is first deposited and then crystallized to form polysilicon, using various crystallization methods, such as rapid thermal annealing (RTA), solid phase crystallization (SPC), excimer laser annealing (ELA), metal induced crystallization (MIC), metal induced lateral crystallization (MILC), sequential lateral solidification (SLS), or the like.

The gate insulating layer 113 is formed to insulate the active layer 121 from a gate electrode 123. The gate insulating layer 113 may be formed of an insulating material, such as a silicon oxide or a silicon nitride, or an insulating organic material.

The gate electrode 123 is formed on the gate insulating layer 113, and an interlayer insulating layer 114 is formed to cover the gate electrode 123. Source and drain electrodes 125 are connected to the active layer 121, via contact holes 127 formed in the interlayer insulating layer 114 and the gate insulating layer 113.

The gate electrode 123 may be formed using various conductive materials. For example, the gate electrode 123 may be formed of Mg, Al, Ni, Cr, Mo, W, MoW, or Au, as a single layer structure or as a multilayer structure.

The interlayer insulating layer 114 may be formed of an insulating material, such as a silicon oxide, a silicon nitride, or an insulating organic material. The contact holes 127 may be formed by selectively removing portions of the interlayer insulating layer 114 and the gate insulating layer 113. The source and drain electrodes 125 are formed of the same materials as described above for the gate electrode 123. The source and drain electrodes 125 are disposed on the interlayer insulating layer 114, so as to bury the contact holes 127, and may have single layer structure or a multilayer structure.

A planarization layer 115 is formed on the source and drain electrodes 125, to protect the TFT and planarize the same. The planarization layer 115 may be formed in various shapes, and may be formed of an organic material, such as a benzocyclobutene (BCB) or acryl, or an inorganic material such as $SiN_x$. The planarization layer 115 may be formed as a single layered, a bi-layered, or a multilayered structure.

The anode electrodes 300A-300C are formed on the planarization layer 115. The anode electrodes 300A-300C are electrically connected to the source and drain electrodes 125, via holes 130 formed in the planarization layer 115.

The TFT is not limited to the above stacked structure. For example, the TFT may also have various other structures, or may be any other suitable type of control element.

FIGS. 3 through 7 are cross-sectional views illustrating a method of manufacturing a top emission-type OLED display apparatus, according to an exemplary embodiment of the present disclosure. However, the manufacturing of TFTs formed on the substrate 100 is omitted.

Figure 3:
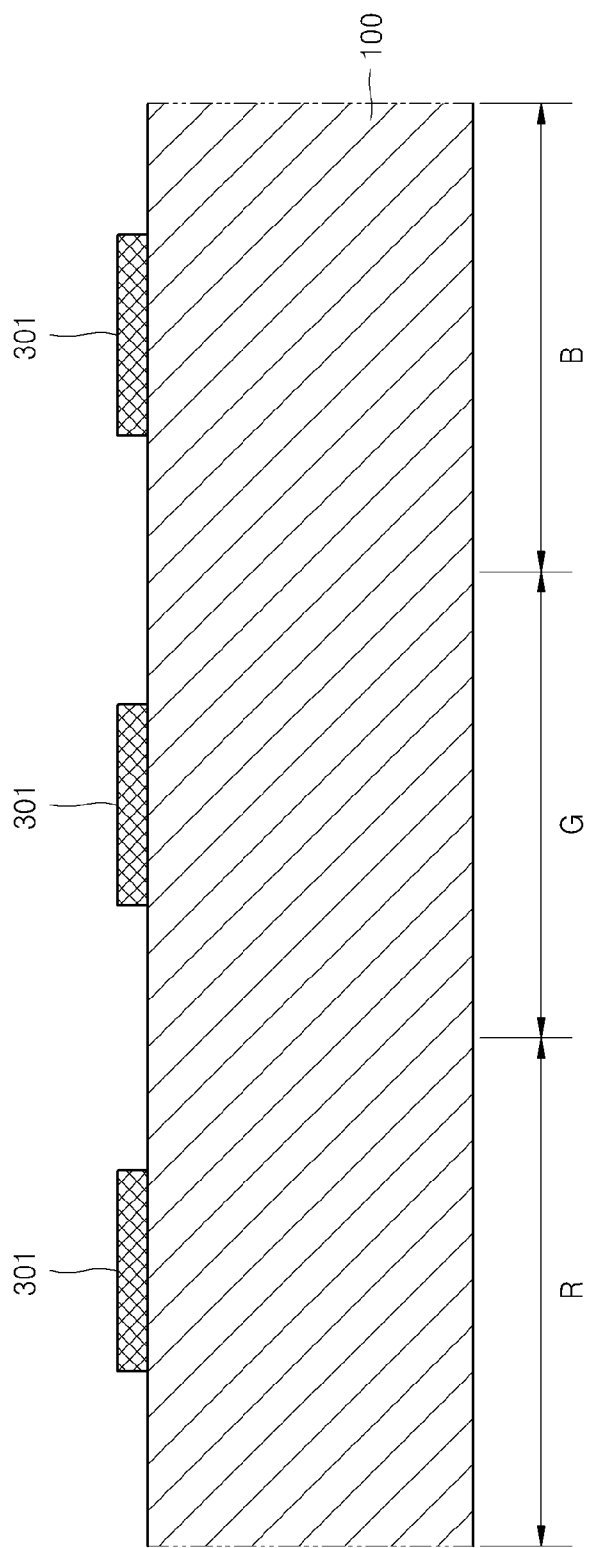

Referring to FIG. 3, first anode electrodes 301 are formed on a substrate 100, in a red (R), green (G), and blue (B) sub-pixel region (sub-pixels). The first anode electrodes 301 have a multilayer structure, including a metal layer and conductive oxide layers disposed above and below the metal layer. The first anode electrodes 301 may have a structure selected from the group consisting of ITO/Ag/ITO, ITO/Ag/ indium zinc oxide (IZO), ITO/Ag alloy/ITO (ATD), ITO/

Ag—Pd—Cu (APC) alloy/ITO, or the like. The metal layer of first anode electrodes 301 operates as a reflective layer or a reflective electrode. According to the current exemplary embodiment, the first anode electrode 301 has an ITO/Ag/ITO structure. The first anode electrodes 301 may be formed by sequentially stacking layers formed by vacuum deposition or sputtering. The stacked layers are the simultaneously etched and patterned, using photolithography. An etchant solution used therein may include nitric acid or acetic acid.

Figure 4A:
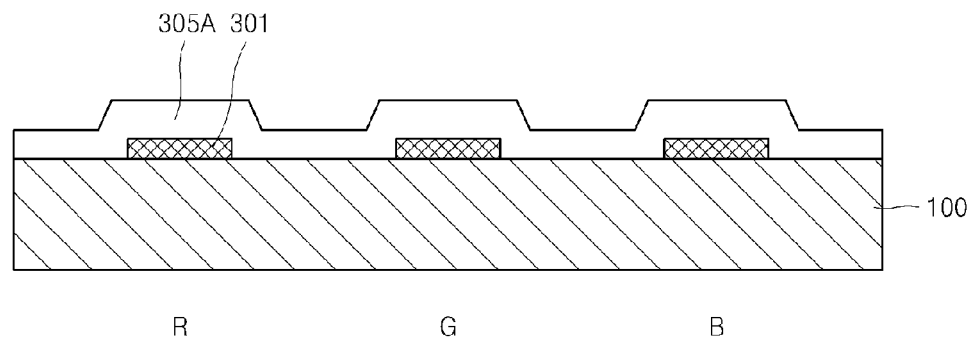
Figure 4B:
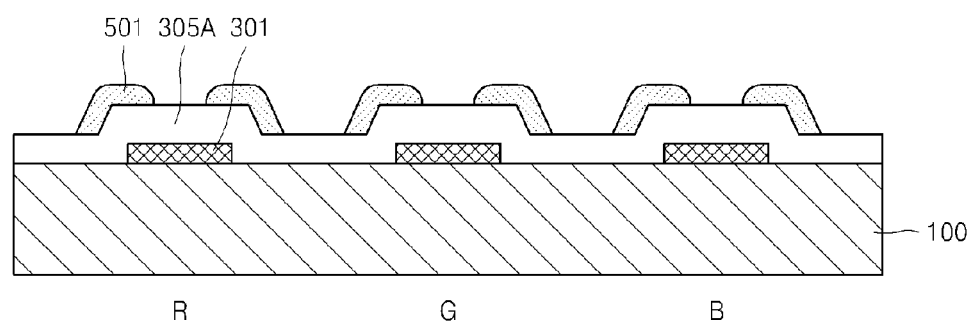
Figure 4C:
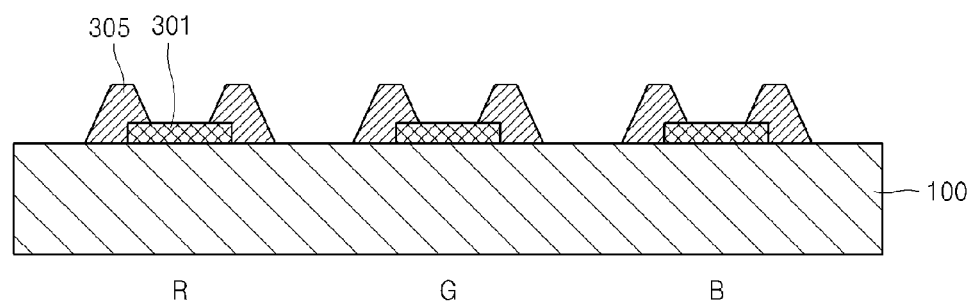

Referring to FIGS. 4A-4C, a cladding 305 is formed on the first anode electrodes 301, using photolithography. The cladding 305 covers edges of the first anode electrodes 301, so as to expose central portions of the first anode electrodes 301 and portions of the substrate 100.

Referring to FIG. 4A, an insulating layer 305A is formed on the substrate 100, covering the first anode electrodes 301, by vacuum deposition or sputtering. The insulating layer 305A may be formed of an acrylic organic compound or an organic insulating material, such as polyamide or polyimide.

Referring to FIG. 4B, a photoresist (not shown) is coated on the substrate 100, to cover the insulating layer 305A. The insulating layer 305A coated with the photoresist is exposed and developed using a photo mask (not shown), to form a photoresist pattern 501 above edges of the first anode electrodes 301.

Referring to FIG. 4C, the photoresist pattern 501 is used as a mask, during etching of the insulating layer 305A, thereby removing portions of the insulating layer 305A where the photoresist pattern 501 is not formed. The etching may be wet etching. An etchant solution used therein may include nitric acid or acetic acid. Then, the photoresist pattern 501 remaining on the insulating layer 305A is removed using a stripper. Thus, the cladding 305 is formed on the edges of the first anode electrodes 301, in a red (R) sub-pixel region, a green (G) sub-pixel region, and a blue (B) sub-pixel region. Then the cladding 305 is hardened by UV irradiation or heating. The cladding 305 is relatively thin and covers the edges of the first anode electrodes 301. The cladding 305 may operate as a pixel defining layer. The cladding 305 may have a thickness of about 2 μm, in order to prevent damage between sub-pixels.

The cladding 305 prevents damage to metal layers of the first anode electrodes 301, when etching a second anode electrode 302 and a third anode electrode 303, using a wet etching method, which will be described later. The cladding 305 may also prevent damage, due to the penetration of an etching solution into the first anode electrodes 301. The cladding 305 may also prevent electrode pull-out defects from occurring during wet etching processes. Accordingly, the second anode electrode 302 and the third anode electrode 303, which are transparent electrode layers, may be patterned without damaging the first anode electrode 301. Thus, the productivity of the OLED display apparatus may be increased.

Figure 5A:
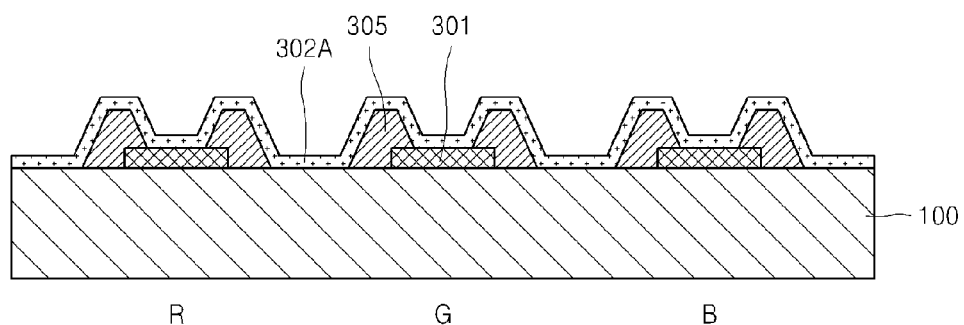
Figure 5B:
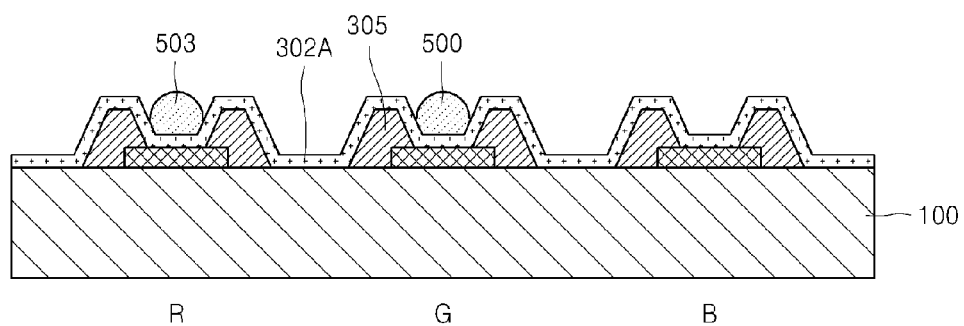
Figure 5C:
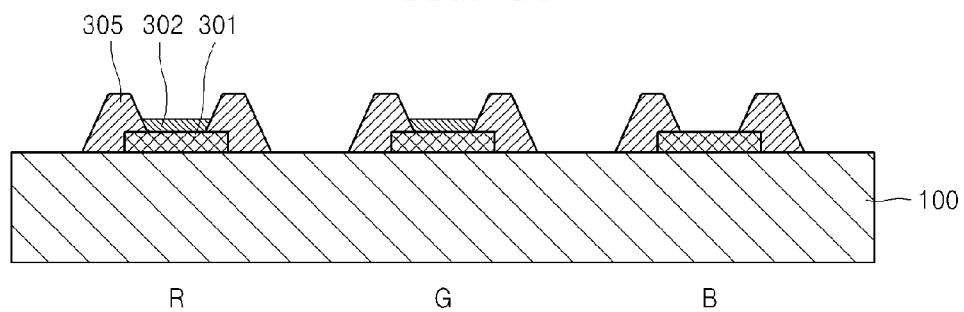

Referring to FIGS. 5A-5C, a second anode electrode 302 is formed on some of the first anode electrodes 301, using a photolithography process. The second anode electrodes 302 are formed only in the red (R) sub pixel regions and the green (G) sub pixel regions.

Referring to FIG. 5A, a transparent conductive layer 302A is formed on the substrate 100, so as to cover the first anode electrode 301 and the cladding 305, using a deposition method or a sputtering method. The transparent conductive layer 302A may be a conductive material, such as ITO, IZO, ZnO, or $In_2O_3$. Referring to FIG. 5B, a photoresist (not shown) is coated on the substrate 100, to cover the transparent conductive layer 302A. The transparent conductive layer 302A coated with the photoresist is exposed and developed using a photo mask (not shown), to form a photoresist pattern 503 on the first anode electrode 301 of the red (R) sub-pixel region and the first anode electrode 301 of the green (G) sub-pixel region.

Referring to FIG. 5C, the transparent conductive layer 302A is etched using the photoresist pattern 503 to remove portions of the transparent conductive layer 302A where the photoresist pattern 503 is not formed. The etching may be performed using a wet etching method. The etchant solution used may include nitric acid or acetic acid. Then the photoresist pattern 503 remaining on the transparent conductive layer 302A is removed using a stripper. Thus, the second anode electrodes 302 are formed on the first anode electrode 301 of the red (R) sub-pixel region and the first anode electrode 301 of the green (G) sub-pixel region. Then the second anode electrode 302 is hardened by UV irradiation or heating.

Figure 6A:
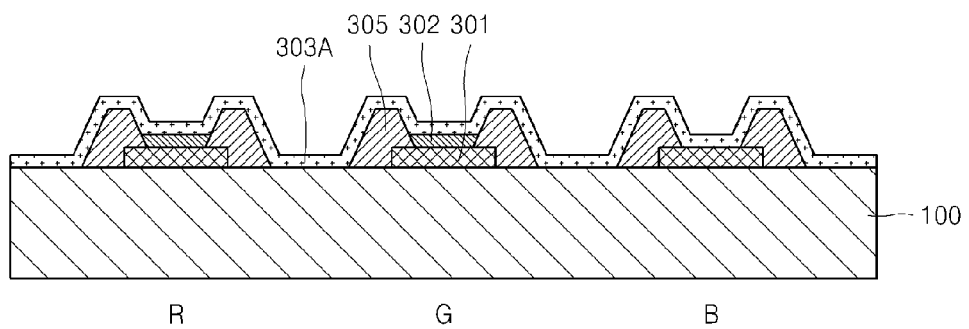
Figure 6B:
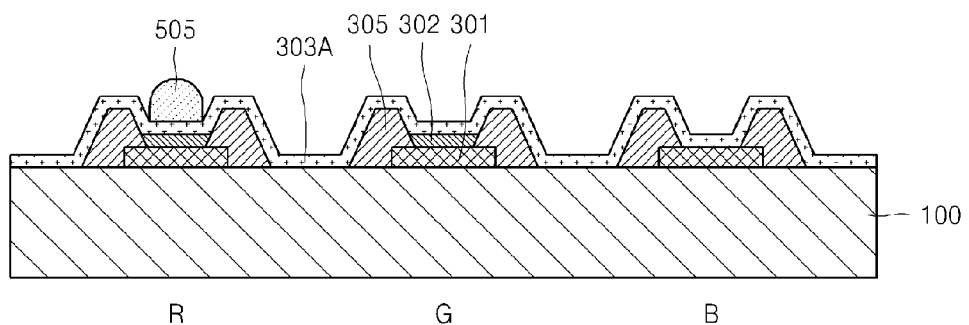
Figure 6C:
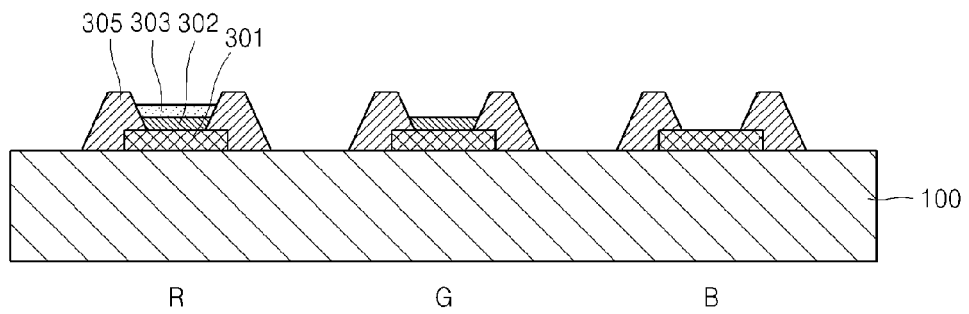

Referring to FIG. 6A-6C, a third anode electrode 303 is formed on the second anode electrode 302, using a photolithography process. The third anode electrode 303 is formed only in the red (R) sub-pixel region.

Referring to FIG. 6A, a transparent conductive layer 303A is formed on the substrate 100, so as to cover the first anode electrode 301 in the blue (B) sub-pixel region, the second anode electrodes 302 in the red (R) sub-pixel region and the green (G) sub-pixel region, and the cladding 305, using a deposition method or a sputtering method. The transparent conductive layer 303A may be formed of a conductive material, such as ITO, IZO, ZnO, or $In_2O_3$.

Referring to FIG. 6B, a photoresist is coated on the substrate 100, so as to cover the transparent conductive layer 303A. The transparent conductive layer 303A coated with the photoresist is exposed and developed using a photo mask (not shown), to form a photoresist pattern 505 on the second anode electrode 302 of the red (R) sub-pixel region.

Referring to FIG. 6C, the transparent conductive layer 303A is etched using the photoresist pattern 505, to remove portions of the transparent conductive layer 303A where the photoresist pattern 505 is not formed. The etching may be performed using a wet etching method. The etchant solution used may include nitric acid or acetic acid. Then the photoresist pattern 505 remaining on the transparent conductive layer 303A is removed using a stripper. Thus, the third anode electrode 303 is formed on the second anode electrode 302 of the red sub-pixel (R) region. Then the third anode electrode 303 is hardened by UV irradiation or heating.

Referring to FIGS. 4A-6C, the anode electrode 300A formed in the red (R) sub-pixel region, has a three-layer structure. The anode electrode 300B formed in the green (G) sub-pixel region has a bi-layer structure. The anode electrode 300C formed in the blue (B) sub-pixel region has a single layer structure. Thus, as the anode electrodes 300A-300C have various layered structures, the thicknesses of the anode electrodes 300A-300C may set according to the colors produced by the sub-pixels thereof. Also, the thicknesses of the first through third anode electrodes 301, 302, and 303 may be different, such that light extraction efficiency of each of the sub-pixels is high. The different thicknesses of the anode electrodes 300A-300C can be adjusted, by adjusting a deposition time of each of the layers.

Referring to FIG. 7, a pixel defining layer 500 is deposited over the substrate 100, on which the anode electrodes 300A-300C are formed. The pixel define layer 500 is an insulating layer that defines unit pixels. The pixel define layer 500 may be formed of an organic material, an inorganic material, or a complex multilayer structure including both organic and inorganic materials. Examples of the inorganic material include a silicon oxide ($SiO_2$), a silicon nitride ($SiN_x$), and a silicon oxide nitride. Examples of the organic material include the same material as the cladding 305, and organic insulating materials, such as an acrylic organic compound, a polyamide, or a polyimide. Openings are formed exposing a portions of the anode electrodes 300A-300C, by etching the pixel define layer 500.

According to the current exemplary embodiment, the cladding 305 and the pixel define layer 500 are separately formed, but alternatively, the cladding 305 may also be formed to operate as the pixel define layer 500. In this case, the manufacturing process for the pixel define layer 500 may be omitted.

Then, as illustrated in FIG. 1, the organic layer 320 is formed in the openings exposing the anode electrodes 300A-300C. The organic layer 320 includes at least an organic emissive layer (EML), and may further include at least one layer selected from the group consisting of a hole injection layer (HIL), a hole transport layer (HTL), an electron transport layer (ETL), and an electron injection layer (EIL).

The organic layer 320 may be formed of a small molecule organic material or a organic polymer material. When the organic layer 320 is formed of a small molecule organic material, an HIL, an HTL, an organic EML, an ETL, an EIL, or the like may be stacked in a single or complex structure. Examples of the small molecule organic material include copper phthalocyanine (CuPc), N,N'-Di(naphthalene-1-yl)-N,N'-diphenyl-benzidine (NPB), tris-8-hydroxyquinoline aluminum (Alq3), and other suitable materials. The organic layer 320 formed of a small molecule organic material may be formed by depositing an organic material, by heating the same under a vacuum atmosphere. In detail, the emissive layer may be formed by interposing masks, including a patterned slit to correspond to pixels, and sequentially depositing the organic material for each of the colors.

When the organic layer 320 is formed of a polymer organic material, the organic layer 320 may have a structure including an HTL and an EML; here, the HTL may be formed of PEDOT, and the EML may be formed of a polymer organic material, such as poly-phenylenevinylene (PPV), or polyfluorene, using a screen printing method or an inkjet printing method. However, the organic layer 320 is not limited thereto.

Next, the cathode electrode 340 is formed on the substrate 100, so as to cover the organic layer 320. The cathode electrode 340 faces the anode electrodes 300A-300C, in the openings of the pixel define layer 500. The cathode electrode 340 may be a transparent electrode, for top emission. The cathode electrode 340 is formed by depositing a metal having a low work function, such as Ag, Mg, Al, Pt, Pd, Au, Ni, Nd, Ir, Cr, Li, Ca, or a combination thereof. Then an auxiliary electrode layer or a bus electrode line may be formed on the cathode electrode 340. The auxiliary electrode layer and bus electrode line may be formed of a transparent conductive material, such as ITO, IZO, ZnO, or $In_2O_3$.

According to the present disclosure, an ITO layer is selectively formed onto anode electrodes having different thicknesses. Thus, no deposition mask for forming additional buffer layers, for controlling a thickness of the sub-pixel for resonance in sub-pixel, is required.

Also, according to the present disclosure, an organic cladding is formed on edges of the anode electrodes that operate as a reflective layer, thereby preventing damage of a metal layer when etching a transparent oxide layer (e.g., ITO layer) formed on the organic cladding, using a wet etching method. The cladding prevents the penetration of the etching solution into the anode electrode and electrode damage. Accordingly, since the ITO layer is patterned without damaging the reflection layer, the quality of the OLED display apparatus may be improved, by reducing the number of defects. The productivity thereof may also be improved, by reducing the material costs.

While the present disclosure has been particularly shown and described with reference to exemplary embodiments thereof, it will be understood by those of ordinary skill in the art that various changes in form and details may be made therein, without departing from the spirit and scope of the present disclosure, as defined by the following claims.

What is claimed is:

1. An organic light-emitting diode (OLED) display apparatus, comprising:
    a substrate having first, second, and third sub-pixel regions;
    first anode electrodes disposed in each of the sub-pixel regions and separated from each other;
    a cladding disposed on edges of the first anode electrodes, the cladding covering and contacting an entirety of side surfaces of the first anode electrodes and edges of top surfaces of the first anode electrodes;
    second anode electrodes disposed on remaining portions of the top surfaces of the first anode electrodes of the first sub-pixel region and the second sub-pixel region; and
    a third anode electrode disposed on the second anode electrode of the first sub-pixel region.

2. The OLED display apparatus of claim 1, wherein the cladding comprises at least one material selected from a group consisting of an acrylic organic compound, polyamide, and polyimide.

3. The organic light-emitting diode (OLED) display apparatus of claim 1, comprised of the first anode electrode comprises at least one structure selected from a group consisting of ITO/Ag/ITO, ITO/Ag/IZO, ITO/Ag alloy/ITO (ATD), and ITO/Ag—Pd—Cu (APC)/ITO.

4. The OLED display apparatus of claim 1, wherein the second anode electrodes are comprised of at least one material selected from a group consisting of ITO, IZO, ZnO, and $In_2O_3$.

5. The OLED display apparatus of claim 1, wherein the third anode electrode comprises at least one material selected from a group consisting of ITO, IZO, ZnO, and $In_2O_3$.

6. The OLED display apparatus of claim 1, wherein the first sub-pixel is a red sub-pixel, and the second sub-pixel is a green sub-pixel, and the third sub-pixel is a blue sub-pixel.

7. The OLED display apparatus of claim 1, comprising:
    the first anode electrodes disposed in each of the sub-pixel regions and separated from each other, the first of the sub-pixel regions comprised of a red sub-pixel, the second of the sub-pixel regions comprised of a green sub-pixel, and the third of the sub-pixel regions comprised of a blue sub-pixel;
    the second anode electrodes disposed on the first anode electrodes of the first sub-pixel region and the second sub-pixel region; and
    the third anode electrode disposed on the second anode electrode of the first sub-pixel region.

8. The OLED display apparatus of claim 1, wherein the first anode electrode comprises a metal layer and electrically conductive oxide layers disposed above and below the metal layer.

9. The OLED display apparatus of claim 1, further comprising:
    an organic emission layer arranged on the third anode; and
    a cathode electrode arranged on the organic emission layer.

10. The OLED display apparatus of claim 1, further comprising:
    a pixel defining layer arranged on the substrate and including a plurality of openings to expose the third anode electrode in the first sub-pixel region, the second anode electrode in the second sub-pixel region and the first anode electrode in the third sub-pixel region;
    an organic layer arrangement including an organic emission layer arranged on exposed portions of the first, second and third anode electrodes; and
    a cathode electrode arranged on the organic emission layer.

11. The OLED display apparatus of claim 10, wherein the first anode electrode comprises at least one structure selected from the group consisting of ITO/Ag/ITO, ITO/Ag/IZO, ITO/Ag alloy/ITO (ATD), and ITO/Ag—Pd—Cu (APC)/ITO, and each of the second and third anode electrodes including at least one material selected from a group consisting of ITO, IZO, ZnO, and $In_2O_3$.

12. The OLED display apparatus of claim 1, wherein the third anode electrode is further from the substrate than the second anode electrodes, and the second anode electrodes are further from the substrate than the first anode electrodes.

13. The OLED display apparatus of claim 1, wherein the first anode electrodes are reflective to visible light and the second and third anode electrodes are transparent to visible light.

14. The OLED display apparatus of claim 1, the cladding to prevent the first anode electrodes from being exposed to an etchant used to pattern the second and third anode electrodes.

15. An organic light-emitting diode (OLED) display apparatus, comprising:
- a substrate having first, second, and third sub-pixel regions;
- first anode electrodes disposed in each of the sub-pixel regions and separated from each other, the first anode electrodes reflecting visible light;
- a cladding disposed on edges of the first anode electrodes, the cladding covering and contacting an entirety of side surfaces of the first anode electrodes and edges of top surfaces of the first anode electrodes, the cladding having openings exposing at least a portion of a top surface each of the first anode electrodes;
- second anode electrodes arranged within the openings in the cladding and on top surfaces of the first anode electrodes arranged within the first sub-pixel region and the second sub-pixel region; and
- a third anode electrode arranged within the opening of the cladding and on a top surface of the second anode electrode arranged within the first sub-pixel region, the second and third anode electrodes being transparent to visible light.

16. The OLED display apparatus of claim 15, wherein the second and the third anode electrodes are comprised of at least one material selected from the a group consisting of ITO, IZO, ZnO, and $In_2O_3$.

17. The OLED display apparatus of claim 15, the cladding to prevent the first anode electrodes from being exposed to an etchant used to pattern the second and the third anode electrodes.

* * * * *